(12) United States Patent
Boe

(10) Patent No.: US 7,965,091 B2
(45) Date of Patent: Jun. 21, 2011

(54) TEST PLATE FOR ELECTRONIC HANDLER

(75) Inventor: Gerald F Boe, Newberg, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 532 days.

(21) Appl. No.: 11/741,921

(22) Filed: Apr. 30, 2007

(65) Prior Publication Data

US 2008/0264826 A1 Oct. 30, 2008

(51) Int. Cl.
*G01R 31/00* (2006.01)
(52) U.S. Cl. .................................. 324/756.07
(58) Field of Classification Search ............... 324/158.1, 324/754, 765
See application file for complete search history.

(56) References Cited

U.S. PATENT DOCUMENTS

| | | | | |
|---|---|---|---|---|
| 5,227,717 A * | 7/1993 | Tsurishima et al. | ........... | 324/754 |
| 5,523,678 A * | 6/1996 | Mitsui | ........................ | 324/158.1 |
| 5,688,127 A * | 11/1997 | Staab et al. | ...................... | 439/66 |
| 5,742,168 A * | 4/1998 | Kiyokawa et al. | ............. | 324/754 |
| 5,842,579 A | 12/1998 | Garcia et al. | | |
| 5,894,217 A * | 4/1999 | Igarashi et al. | ............. | 324/158.1 |
| 6,075,255 A * | 6/2000 | Liao et al. | ........................ | 257/48 |
| 6,104,204 A * | 8/2000 | Hayama et al. | ................ | 324/760 |
| 6,304,073 B1 * | 10/2001 | Saito | ........................... | 324/158.1 |
| 6,776,642 B1 * | 8/2004 | McHugh et al. | ............... | 439/331 |
| 6,942,137 B2 * | 9/2005 | Bolde et al. | ................... | 228/44.7 |
| 7,161,346 B2 | 1/2007 | Fish et al. | | |
| 7,173,432 B2 | 2/2007 | Garcia et al. | | |
| 7,258,703 B2 * | 8/2007 | Cheng et al. | ................. | 29/25.01 |
| 7,400,161 B2 * | 7/2008 | Saito | .............................. | 324/765 |
| 2003/0178988 A1 | 9/2003 | Kim | | |
| 2005/0062466 A1 * | 3/2005 | Miyamoto | ................. | 324/158.1 |
| 2005/0266604 A1 * | 12/2005 | Byquist | ............................ | 438/73 |
| 2005/0275398 A1 * | 12/2005 | Yamashita | ................. | 324/158.1 |
| 2006/0154386 A1 * | 7/2006 | Cheng et al. | .................... | 438/15 |

* cited by examiner

*Primary Examiner* — Ha Tran T Nguyen
*Assistant Examiner* — Joshua Benitez
(74) *Attorney, Agent, or Firm* — Young Basile

(57) ABSTRACT

A gap set device for an electronic component handler is provided. The electronic component handler includes a test module operative to load, test and unload electronic components. The electronic components are received in test pockets provided on a test plate. The test pockets include at least one corner relief to improve loading efficiency.

16 Claims, 5 Drawing Sheets

FIG - 1
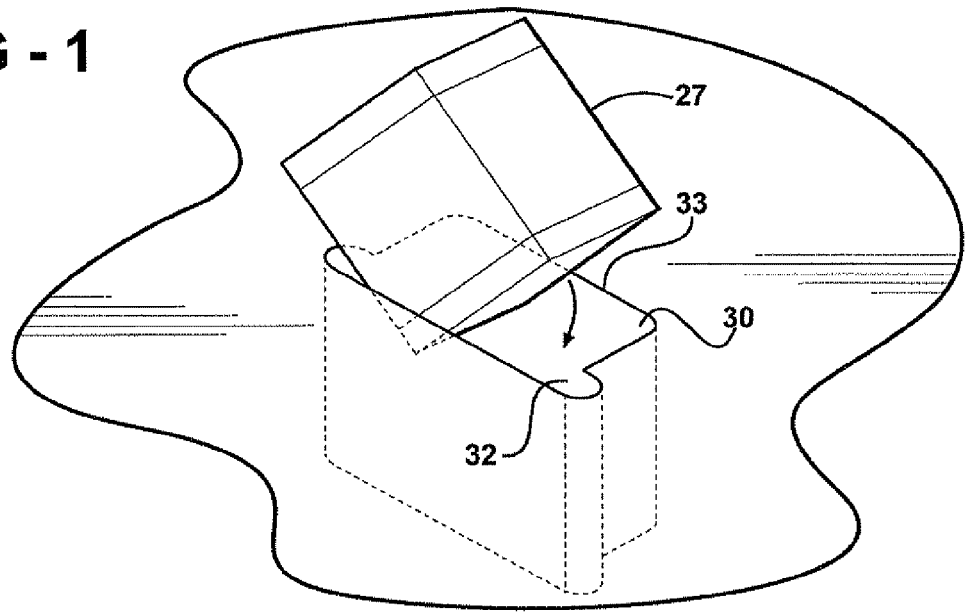
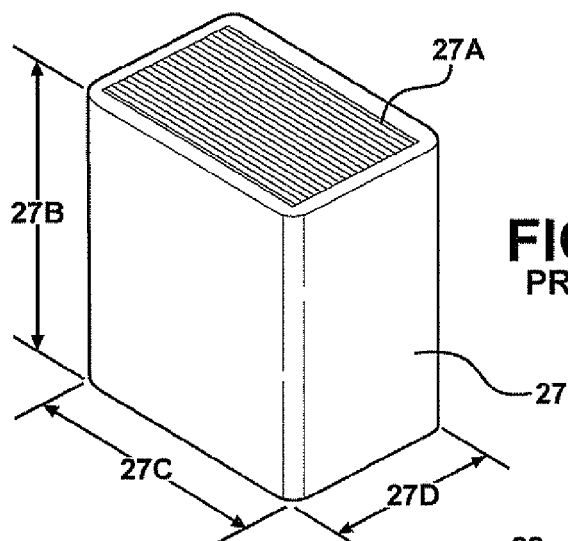
FIG - 2A
PRIOR ART
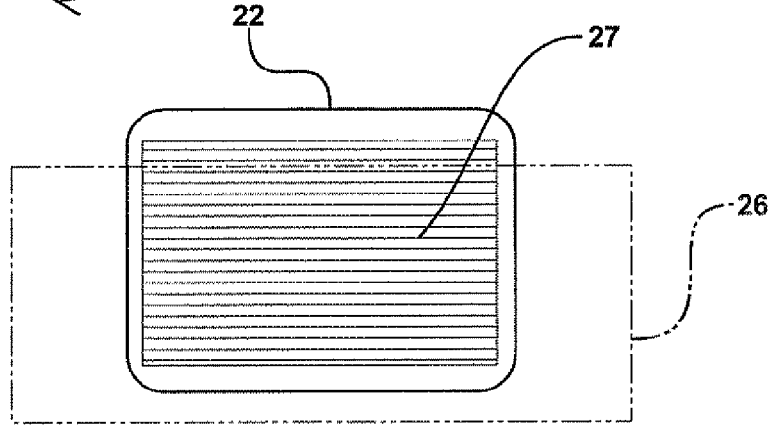
FIG - 2B
PRIOR ART

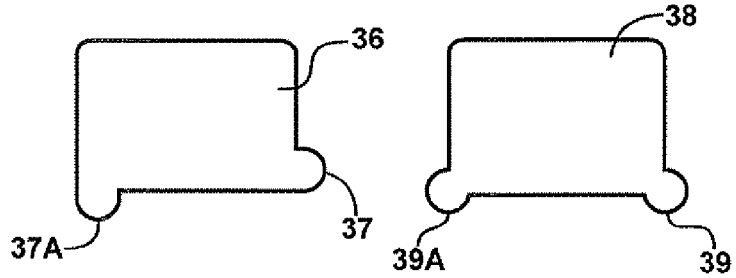
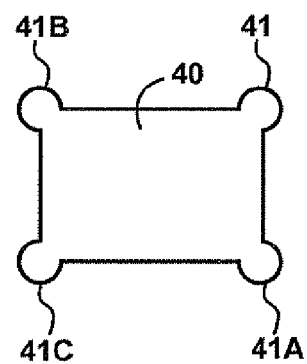
FIG - 4A   FIG - 4B   FIG - 4C
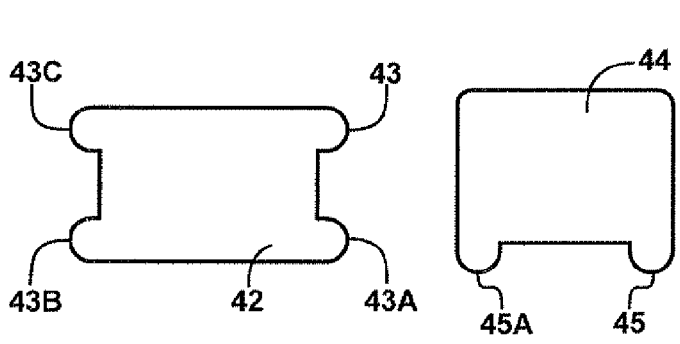
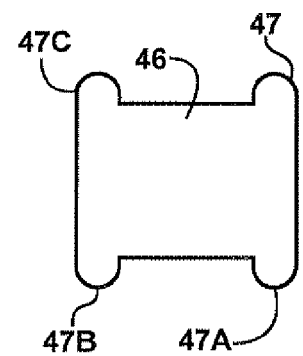
FIG - 4D   FIG - 4E   FIG - 4F

US 7,965,091 B2

TEST PLATE FOR ELECTRONIC HANDLER

FIELD OF THE INVENTION

This invention relates to a test plate pocket that increases the loading efficiency for an electronic component handler.

BACKGROUND OF THE INVENTION

Electronic components are handled by a variety of different electronic component handlers. These different handlers include but are not limited to products sold by Electro Scientific Industries, Inc. of Portland, Oreg., the assignee of the present patent application. Electro Scientific Industries, Inc. sells a variety of electronic component handlers including but not limited to a high volume MLCC tester sold as the Model 3300.

Commonly assigned U.S. Pat. No. 5,842,579 entitled Electrical Circuit Component Handler describes an electronic component handling machine. With reference to FIG. 5 there is shown an overall pictorial view of the electronic component handler 2 of U.S. Pat. No. 5,842,579, the entirety of which is incorporated herein by reference. U.S. Pat. No. 5,842,579 illustrates handler 2 having a plurality of test or contactor modules 24 thereon including a loading frame 104 and a blow off module 22. In operation, electronic components are passed through load frame 104 and are individually drawn into test seats or pockets 10 found on a test plate 8. Test pockets 10 typically are formed as apertures and are organized in concentric rings that are continuous about test plate 8. Different component types may require different pocket shapes, including different pocket depths. FIG. 6 illustrates a prior art test plate.

With continued reference to U.S. Pat. No. 5,842,579 and FIG. 5 it is seen that test plate 8 is positioned at an angle relative to vertical. Test plate 8 may be configured at a forty five degree angle. MLCC components are passed through loading frame 104 and are directed by fences 108a-d toward test pockets 10. One component is received in one test pocket 10. In operation, test plate 8 indexes the loaded components toward testing modules 24 where those components are tested. As test plate 8 continues to index the components are presented to blow off module 22 where the components are removed from the machine and organized based on the test data.

With reference to FIG. 2A there is shown a representative prior art electronic component 27 which includes electrode layers 27A. The size of component 27 is defined by a length 27B, a width 27C and a thickness 27D. The ratio between length 27B and width 27C define the aspect ratio of component 27.

In the example where test plate 8 is positioned at a forty five degree angle, FIG. 2B shows each test pocket 22 includes a loading area 26. At 45° and due to gravity the loading area comprises approximately 80% of the pocket width and the full pocket length. When test plate 8 is positioned at a forty five degree angle a small part of the upper portion of the test pocket width is not substantially involved in loading but rather that small portion merely operates to contain the electronic component after it has been loaded.

SUMMARY OF THE INVENTION

A need has arisen to increase the loading efficiency of electronic components into test seats on electronic component handlers. A removable test plate for use with an electronic component handler is provided where the test plate includes a plurality of test pockets wherein at least one of the test pockets includes at least one corner relief. In one embodiment the test pocket may include multiple corner reliefs, which may be circular in their configuration.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 1 is a perspective view of an individual electronic component being loaded into a test seat according to an embodiment of the invention;

FIG. 2A is a perspective view of an example electronic component;

FIG. 2B is a top plan view of an electronic component captured by a single test pocket;

FIG. 4A is a plan view of a test pocket according to a second embodiment;

FIG. 4B is a plan view of a test pocket of a third embodiment;

FIG. 4C is a plan view of a test pocket of a fourth embodiment;

FIG. 4D is a plan view of a test pocket of a fifth embodiment;

FIG. 4E is a plan view of a test pocket of a sixth embodiment;

FIG. 4F is a plan view of a test pocket of a seventh embodiment;

DETAILED DESCRIPTION OF THE PREFERRED EMBODIMENT

A test plate for an electronic component handler is provided. The test plate includes test pockets. The test pockets are apertures in the test plate. Electronic components are delivered to an area near the test pockets and fall into or are pulled into the test pocket. At least one corner relief is provided for a test pocket to increase loading efficiency.

Figure 2C:
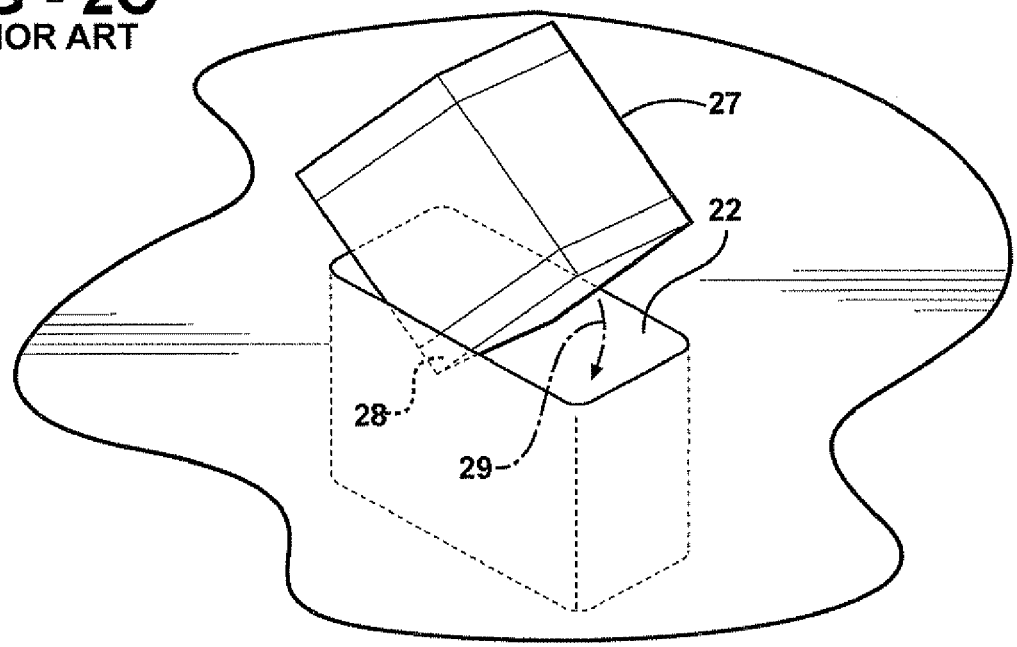
FIG. 2C illustrates a perspective view of a prior art electronic component being loaded into a test seat/pocket.
Figure 3:
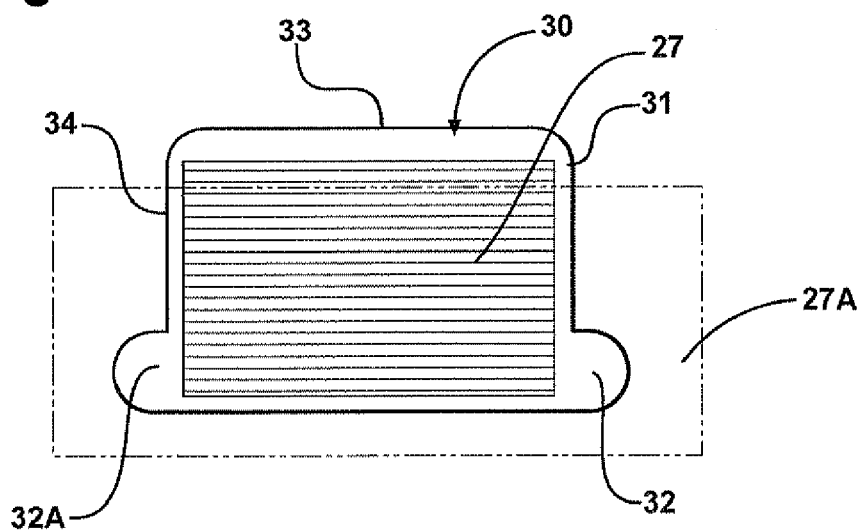
FIG. 3 is a plan view of an electronic component captured by a test pocket according to a first embodiment.
Figure 5:
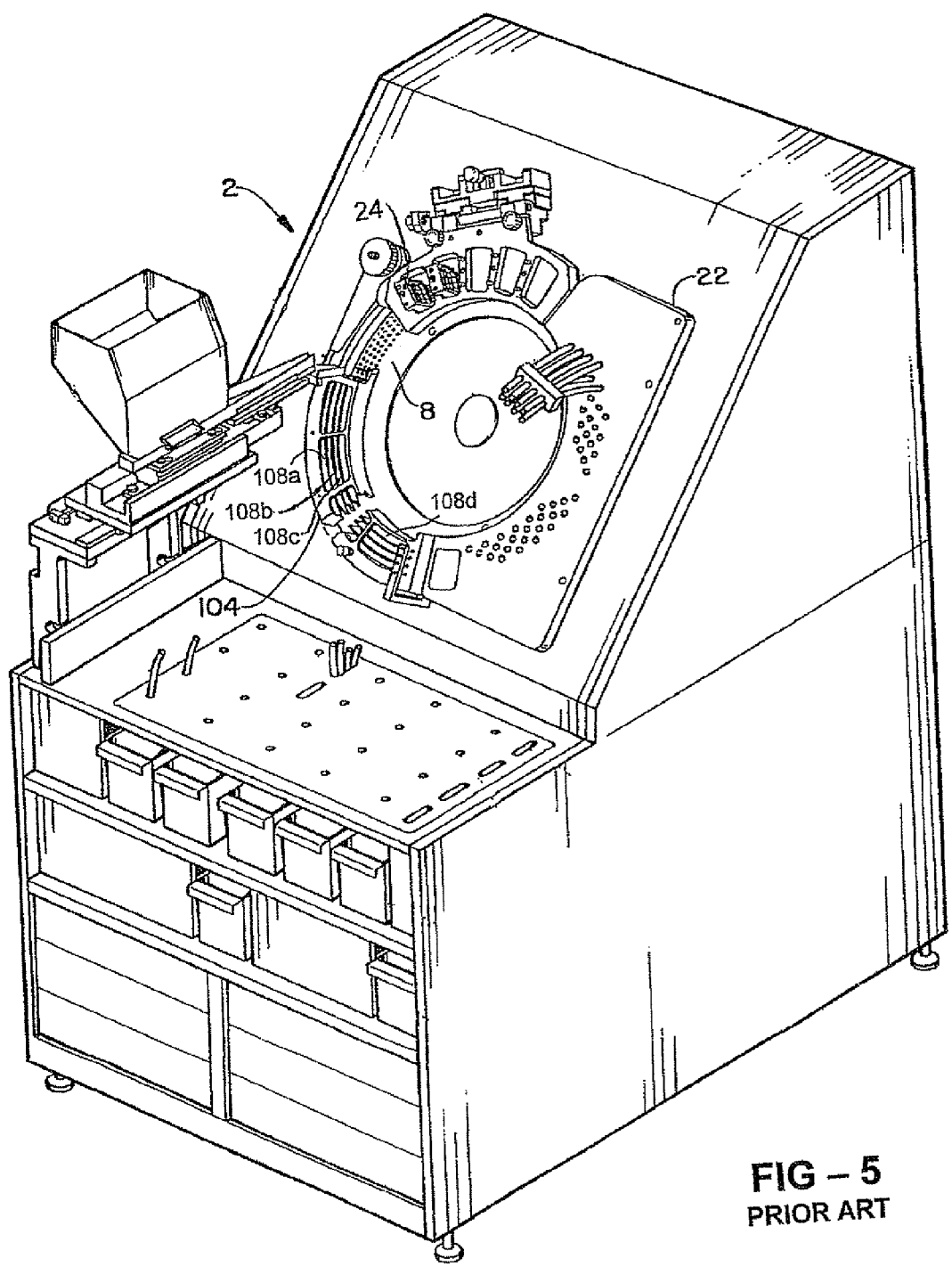
FIG. 5 is an overall pictorial view of an electronic component handling machine from U.S. Pat. No. 5,842,579.
Figure 6:
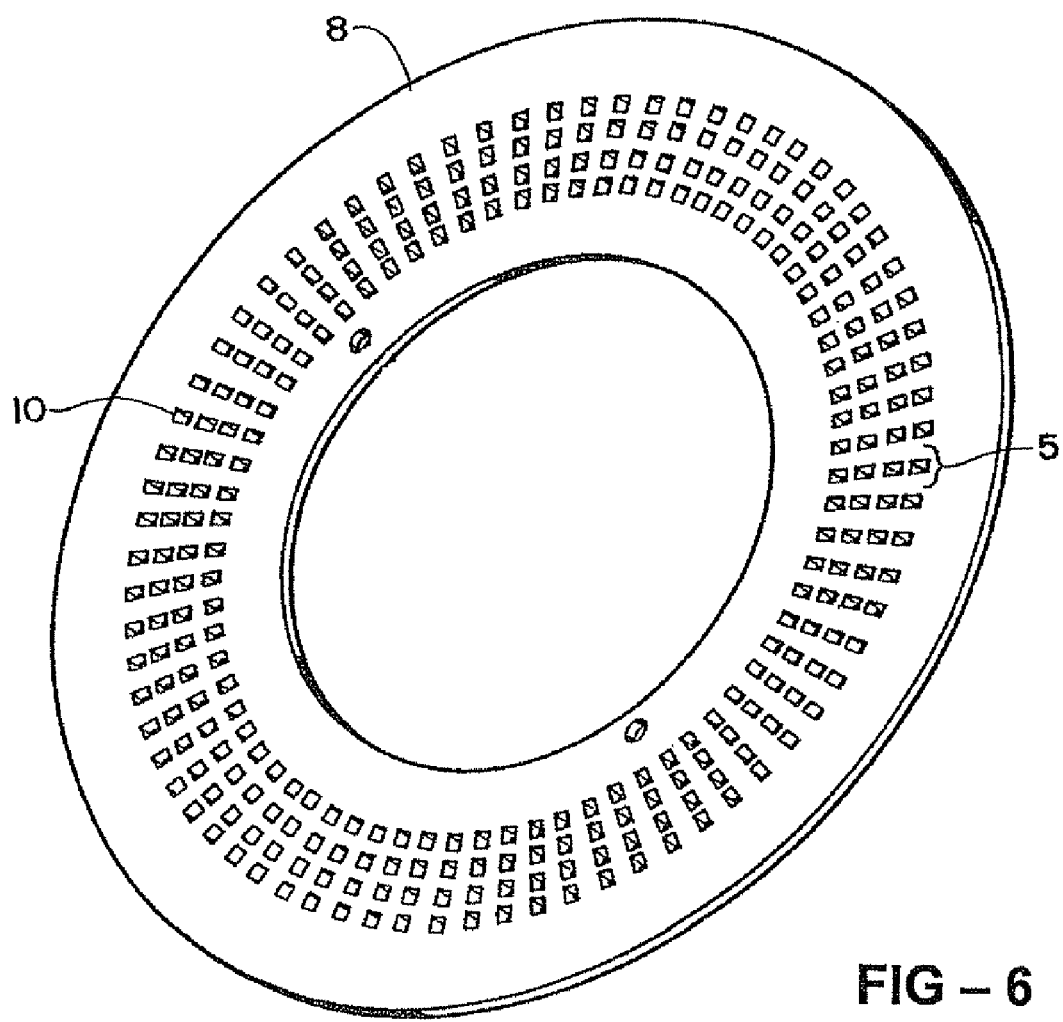
FIG. 6 is a pictorial view of the test plate from U.S. Pat. No. 5,842,579.

With reference to FIGS. 3-4F wherein like elements are numbered alike there is shown a pocket for use with a test plate in an electronic component handler. Electronic components such as MLCC's and such as those shown in FIG. 2A, come in a variety of sizes, weights and aspect ratios. Certain types of electronic components may be more difficult to load into a test pocket on a test plate. For example, electronic components having an aspect ratio of one to one and of comparatively higher mass may have a lower loading efficiency.

With reference to FIG. 1 there is shown an exploded perspective view of a test pocket 30 including a corner relief 32. Corner relief 32 represents an expanded area in the area of test pocket corner. Corner relief 32 may extend the full depth of test pocket 30. By creating a corner relief electronic component 27 can drop into pocket 30 with a reduced likelihood that it will become trapped, captured or otherwise obstructed. Sidewalls 33 and 34 of test seat 30 may then capture electronic component 27 so that electronic component 27 can be passed to a testing module on the machine. For example, with regard to a 1210 chip inclusion of corner reliefs 32 of the type shown in FIG. 1 have improved loading efficiency from approximately eight five percent to approximately ninety five percent.

Corner relief 32 may be positioned in a number of different fashions in order to improve the loading efficiency of electronic components into the electronic component testing machine. These alternate embodiments are shown in FIGS. 4A-4F With reference to FIG. 4A a first alternate embodiment is shown. FIG. 4A illustrates a test pocket 36 having corner reliefs 37 and 37A. As can be seen in FIG. 4A relief 37 extends in a direction lengthwise of the test seat 36 while pocket 37A projects in a direction widthwise to pocket 36.

With reference to FIG. 4B there is shown a second embodiment. Test seat 36 includes corner pockets 39 and 39A. Corner pockets 39 and 39A extend in a direction offset from the length and width of pocket 36.

FIG. 4C shows a fourth embodiment. FIG. 4C includes four corner pockets 41, 41A, 41B and 41C. The corner pockets illustrated in FIG. 4C all extend at an angle offset from the width and length of pocket 36.

With reference to FIG. 4D there is shown a fifth embodiment. FIG. 4D illustrates test seat 36 having four pockets all extending in the direction of the length of the test seat 36 while FIG. 4E shows a sixth embodiment where the pockets all extend widthwise to test seat 36.

FIG. 4F represents a sixth embodiment. In the sixth embodiment the pockets may extend widthwise to the test seat 36.

Corner reliefs may be drilled out using known micro drilling techniques. While the corner reliefs have been illustrated as being circular the corner reliefs may be any of a number of different shapes including any polygon.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A removable test plate for use with an electronic component handler, the test plate including a plurality of test pockets wherein at least one of the test pockets includes at least one corner relief and wherein:
   the removable test plate is ring-shaped;
   the at least one test pocket includes at least two corner reliefs;
   the at least one test pocket is defined by a radially-outer edge in parallel with a radially-inner edge and by opposing side edges perpendicular to the radially-outer edge and the radially-inner edge, outer limits of a length of the at least one test pocket defined by the opposing side edges and outer limits of a width of the at least one test pocket defined by the radially-inner and radially-outer edges;
   the at least one test pocket extends from the top surface of the test plate to a bottom surface of the test plate; and
   at least one of the at least two corner reliefs extends beyond the outer limits of the length and of the width of the at least one test pocket along only one of the radially-inner edge, the radially-outer edge and one of the opposing side edges.

2. The removable test plate as in claim 1 wherein each of the at least two corner reliefs extends to a same depth as the plurality of test pockets.

3. A removable test plate for use with an electronic component handler, the test plate including a plurality of test pockets wherein at least one of the test pockets includes at least one corner relief and wherein:
   each of the plurality of test pockets includes only two corner reliefs;
   the removable test plate is ring-shaped;
   each test pocket is defined by a radially-outer edge in parallel with a radially-inner edge and by opposing side edges perpendicular to the radially-outer edge and the radially-inner edge, outer limits of a length of each test pocket defined by the opposing side edges and outer limits of a width of each test pocket defined by the radially-inner and radially-outer edges;
   each test pocket extends from the top surface of the test plate to a bottom surface of the test plate; and
   each of the two corner reliefs extends beyond the outer limits of the length and of the width of a respective test pocket in only a direction of the length at a position in contact with one of the radially-outer edge and the radially-inner edge.

4. The removable test plate as in claim 3 wherein each corner relief is arcuate.

5. The removable test plate as in claim 4 wherein the plurality of test pockets is organized in concentric rings on the test plate.

6. A test plate for an electronic component handler, the electronic component handler comprising a plurality of modules, the modules including a module operative to load electronic components into a plurality of component seats on the test plate; a module operative to test the electronic components and a blow off module for sorting the electronic components; wherein the improvement comprises:
   at least one of the test plate test pockets including a corner relief wherein:
   the at least one test pocket includes a plurality of corner reliefs;
   the at least one test pocket is defined by a radially-outer edge in parallel with a radially-inner edge and by opposing side edges perpendicular to the radially-outer edge and the radially-inner edge, outer limits of a length of the at least one test pocket defined by the opposing side edges and outer limits of a width of the at least one test pocket defined by the radially-inner and radially-outer edges;
   the at least one test pocket extends from the top surface of the test plate to a bottom surface of the test plate;
   each of the plurality of corner reliefs extends from the top surface of the test plate to the bottom surface of the test plate; and
   each of the plurality of corner reliefs extends beyond the outer limits of the length and of the width of the at least one test pocket along only one of the radially-inner edge, the radially-outer edge and one of the opposing side edges.

7. The test plate as in claim 6 wherein the plurality of test pockets is arranged in concentric rings.

8. A test plate for use with an electronic component handler to support a plurality of test components having a height, width and depth, comprising:

an annular test surface, an opposed second surface and a uniform thickness; and test pockets extending into the test surface forming respective openings in the opposed second surface and arranged around a circumference of the annular test surface, each of the test pockets dimensioned to support a respective test component and including at least one cut-out corner extending from the test surface along an entire depth of the test pocket; and wherein each of the test pockets is defined by a radially-outer edge in parallel with a radially-inner edge and by opposing side edges perpendicular to the radially-outer edge and the radially-inner edge, outer limits of a length of each of the test pockets defined by the opposing side edges and outer limits of a width of each of the test pockets defined by the radially-inner and radially-outer edges; and the at least one cut-out corner comprises only two cut-out corners, each extending beyond the outer limits of the length and of the width of a respective test pocket in only a direction of the length at a position in contact with one of the radially-outer edge and the radially-inner edge.

9. The test plate as in claim 8 wherein the test pockets are arranged in a plurality of concentric rings on the annular test surface.

10. The test plate as in claim 8 wherein each cut-out corner is arcuate in shape.

11. The test plate as in claim 8 wherein each of the test pockets has a rectangular shape on the test surface and includes two cut-out corners extending from corners on opposing ends of the rectangular shape.

12. The test plate as in claim 11 wherein the two cut-out corners are arcuate in shape, start on adjacent corners of the rectangular shape and extend along only a portion of a respective one of the opposing ends.

13. The test plate as in claim 11 wherein the two cut-out corners are arcuate in shape, start on adjacent corners of the rectangular shape and extend along respective portions of a common edge of the rectangular shape.

14. The test plate as in claim 8 wherein each of the test pockets has a rectangular shape on the test surface and includes a cut-out corner extending from each of four corners of the rectangular shape.

15. An electronic component handler comprising a first module configured to load the plurality of test components into a respective test pocket of the test plate according to claim 8, a second module configured to test the test components and a blow off module configured to sort the test components.

16. The electronic component handler of claim 15 wherein the test plate is a removable test plate.

* * * * *